United States Patent [19]

Langgard et al.

[11] Patent Number: 5,009,613
[45] Date of Patent: Apr. 23, 1991

[54] SPRING CONTACT TWISTER PROBE FOR TESTING ELECTRICAL PRINTED CIRCUIT BOARDS

[75] Inventors: Ulf R. Langgard, Overland Park, Kans.; William E. Thurston, Gladstone, Mo.

[73] Assignee: Interconnect Devices, Inc., Kansas City, Kans.

[21] Appl. No.: 517,239

[22] Filed: May 1, 1990

[51] Int. Cl.⁵ .......................................... H01R 11/18
[52] U.S. Cl. ................................... 439/482; 439/824
[58] Field of Search ...................... 324/158 F, 158 P; 439/824, 482, 912, 819, 816

[56] References Cited

U.S. PATENT DOCUMENTS

| 1,349,405 | 8/1920 | Brown. | |
|---|---|---|---|
| 1,973,234 | 9/1934 | Tsavaris. | |
| 2,644,145 | 6/1953 | Adams. | |
| 3,378,810 | 4/1968 | Dorrell. | |
| 3,458,851 | 7/1969 | Webb. | |
| 4,050,762 | 9/1977 | Hines et al. | 439/824 |
| 4,200,351 | 4/1980 | Long et al. | 439/824 |
| 4,397,519 | 8/1983 | Cooney | 439/824 |
| 4,560,926 | 12/1985 | Cornu et al. | 439/482 |
| 4,787,861 | 11/1988 | Kruger et al. | 439/819 |
| 4,824,378 | 4/1989 | Betz | 439/824 |

Primary Examiner—David L. Pirlot
Attorney, Agent, or Firm—Wm. Bruce Day

[57] ABSTRACT

A spring contact twisting electrical contact spring probe for testing electrical printed circuit boards includes a barrel having a spring seating end and an open end, a compression spring seated in the closed end of the barrel, and a plunger inserted into the barrel. The plunger includes a tail section, connected to a twister section comprising a square rod twisted along its longitudinal axis, and a shaft or probe section that protrudes from the barrel and includes the probe tip. Four crimps in the barrel retain the plunger inside the barrel and interact with the helical crests on the twister section to cause the plunger to rotate along its longitudinal axis as it reciprocates within the barrel. The twister section is retained entirely within the barrel at all times. The rotating plunger tip has edges that scrape off contaminants or coatings on the test sites of the circuit boards to obtain a sufficient electrical connection.

12 Claims, 2 Drawing Sheets

SPRING CONTACT TWISTER PROBE FOR TESTING ELECTRICAL PRINTED CIRCUIT BOARDS

BACKGROUND OF THE INVENTION

1. Field of The Invention

The present invention is directed to a twister probe for use in apparatus that test printed circuit boards. More particularly, the present invention is directed to a spring contact probe having a plunger that reciprocates in a barrel and rotates as it reciprocates.

2. Related Art

Spring contact probes are commonly used in testing printed circuit boards and other types of circuits that require a number of contact points to be checked for continuity or correct electrical signals. Such contact probes are received into probe receptacles that are typically fitted into apertures in a testing board. The entire board is moved toward and away from the testing subject by an electromechanical or pneumatic means. Typically, probes are mounted throughout the surface area of a testing board in rows and columns in high density arrays. A compression spring inside each probe forces the plunger against the printed circuit board.

When printed circuit boards are made and after electrical components are soldered to them, the runners are dirty. They are covered with lacquers and highly corrosive fluxes. In the past, these contaminants have been washed from the printed circuit boards by various solvents prior to testing them for proper electrical conductivity. Many of the solvents used for cleaning printed circuit boards have been restricted or banned or are being phased out under federal government regulations designed to improve the general environment. One such family of solvents, is for example, fluorocarbons. As a consequence, circuit boards are increasing being tested without being cleaned. Many of the currently used testing probes will not reliably penetrate the debris on the circuit boards and make good mechanical and electrical contact with the circuit board runners and consequently lead to erroneous indications of open circuits.

To overcome this difficulty, some manufactures have produced a so called "pin-point" probe that will usually penetrate the layer of contaminants on a circuit board. Unfortunately, however, such pin-point probes sometimes stick into the runners and will not retract when the test is completed. In theory, a probe pressed against the circuit board with sufficient force will penetrate the layers of contaminants and permit effective testing of the circuits on the board. In practice, however, the force that can be applied to a probe is constrained by the diameter of the plunger body and probe tip, and the diameter of the compression spring that urges the plunger body toward the printed circuit board. Only by making the probe tip small can sufficient pressure be exerted against the runner to ensure that the debris are penetrated by the probe tip. This, however, leads to the probe tip's sticking into the circuit board or circuit board runners.

Other efforts to permit testing of dirty circuit boards in hostile environments contaminated with free particles and corrosive chemicals have been developed. They employ some means for ensuring that the plunger of the probe will twist or rotate as the plunger reciprocates within the barrel. In such probes, the probe tip acts like a drill bit, turning or rotating along its longitudinal axis as it contacts the printed circuit board. The rotating or twisting motion of the sharp point of the probe enables the probe to cut through most debris resulting from the manufacture of the circuit board.

One twisting probe has a barrel that is opened at both ends, a circumferential crimp near the probe tip end of the barrel and a plunger within the barrel. The plunger includes a probe tip end and a twisted end that projects through the rear of the barrel. The rear of the barrel has a square opening that the twisted plunger passes through, causing the plunger to rotate along its longitudinal axis as it reciprocates within the barrel. The use of this probe is not known to the inventor and it could not be used in any standard printed circuit board testing apparatus because the portion of the plunger extending outwardly of the barrel would interfere with mounting the probe in a standard probe receptacle or socket.

Another twister probe includes a barrel having an open front end and rear end, with the probe tip comprising a portion of the plunger, which is seated within the barrel and reciprocates therein. A compression spring urges the plunger outward from the barrel. The barrel includes a sleeve with a curved cam slot along its length. A small cylindrical pin is inserted into the plunger body perpendicular to the longitudinal axis of the plunger body. The pin acts as a cam follower that follows the curved cam surface of the slot in the sleeve, or the enlarged portion of the barrel. This style of probe suffers from significant drawbacks. First, it includes four parts, namely the barrel, the probe, the spring and the cam follower. In addition the cam itself must be cut into the side wall of the barrel. These features lead to excessive manufacturing costs. Further, and more seriously, the cam slot can be easily contaminated by particles of lacquer, fluxes, and solder that are broken free of the printed circuit board during testing. In particular, even small amounts of flux that contact the upper exposed portion of the plunger in the cam slot can be carried into the interior of the barrel when the plunger reciprocates, and will corrode the inner portions of the probe sufficiently to produce intermittent open circuits, thus rendering the probe unreliable. Exacerbating these contamination problems, such probes are generally mounted below the subject circuit board, that is, with the probe tip pointing up. Thus, the debris loosened by the twisting probe tip falls down onto the probe itself.

An effort to overcome a related problem is found in U.S. Pat. No. 3,458,851 issued to Webb as Administrator of the National Aeronautics and Space Administration on July 29, 1969 for Electrical Connector Pin With Wiping Action. Webb '851 discloses an electrical connector pin having a spring biased cylindrical connector pin to be received within a female socket. Foreign matter in the socket may prevent good electrical contact with a connector pin that is inserted straight into the socket. Webb '851 reduces the likelihood of this occurrence by causing the connector pin to rotate as it is extended from its housing by the biasing spring, causing the connector pin to wipe the side wall of the cylindrical socket as the connector pin enters the socket.

Webb '851 accomplishes this rotation of the connector pin as it reciprocates within the housing by having an indented boss in the housing that rides in a helical groove along a portion of the connector pin shaft that is retained within the housing. There is only one indented boss, and only one helical groove. The camming action of the indented boss riding in the helical groove causes the connector pin to rotate as it reciprocates. The rear of the tubular housing is closed and sealed. The front end of the tubular housing is open to allow the connector pin to extend beyond the housing and to allow air to enter and to escape from the housing as the connector pin reciprocates therein. An inwardly extending circumferential flange at the front edge of the tubular housing forms a stop that prevents a larger diameter connector pin portion from moving outside the housing.

Webb '851 might appear to provide a good solution to the problem at hand, namely, testing printed circuit boards. This is not the case. Webb 851 includes a number of characteristics that make it unsuitable for testing printed circuit boards and that would cause serious difficulties if it were adapted for such use by, e.g., replacing the rounded tip of the connector pin with a cutting tip. First, testing printed circuit boards requires many hundreds of thousands of probes. In addition, they must be manufactured to very close tolerances to perform correctly. Consequently, the cost of manufacture, the simplicity of design, and the ease of reproducing the probe accurately are all vital considerations. Webb 851 includes a helical groove in the connector pin shaft. It is difficult and expensive to cut or otherwise form grooves in shafts and it is not economically viable in this use.

Second, pointing accuracy of the probe is of the utmost importance in testing printed circuit boards. The testing apparatus is programmed to expect a specific signal from each probe in the densely packed arrays. Each probe is aimed at a precise, specific point on the printed circuit board. If one or more probes do not hit their targets when the circuit board is tested, the test results may be wrong. Circuit board runners are sometimes very narrow and are easily missed. Incorrectly aimed or pointed probes may miss the test pad altogether. Probes that do not hit their targets can incorrectly indicate the presence of either an open or closed circuit. The strike point of a probe used for testing printed circuit boards needs to be within about thirty ten-thousandths of an inch (0.0030 inch; 0.0076 cm) of the target. This degree of accuracy is not achieved by the Webb '851 connector pin, which relies on a pilot socket portion and a pilot pin tip having a smaller diameter than the connecting portion of the connector pin to locate the connector pin in the receiving socket. The use of a single indented boss riding in a single helical groove causes the connector pin to wobble as it reciprocates within the housing as the forces exerted on the connector probe by the indented boss riding in the groove are essentially perpendicular to the axis of the connector pin and, after the limit of the sideways movement of the connector pin is reached, are translated into rotational forces. Because the lateral or sideways force exerted on the connector pin is essentially constant in both magnitude and direction and the connector pin reciprocates within the housing, the connector pin can be expected to wobble throughout its entire reciprocation cycle.

Further, the pivot bearing includes two small facing bearing surfaces at the back end of the connector pin, which are largely responsible for aiming the connector pin and these bearing surfaces offer little contact area and are restricted to only the end of the connector pin. Consequently, these bearing surfaces do not provide a high degree of pointing accuracy.

Also demonstrative of the inadequate pointing accuracy of the connector pin of Webb '851 is the fact that the rear of the housing is sealed, which requires the air that must enter and escape from the interior of the housing must pass through the gap between the connector pin and the housing. This structure is wholly inadequate for the task at hand because a gap large enough to admit the necessary volume of air will also admit the various contaminants of dirty printed circuit boards.

Accordingly, there is a need for electrical spring contact probe that can reliably penetrate the dirt and debris that typically accompany unwashed printed circuit boards and that will not be subject to contamination from that debris.

SUMMARY OF THE INVENTION

Accordingly, it is a primary object of the present invention to provide an electrical spring contact probe that can reliably and repeatedly penetrate the lacquers, fluxes, and other debris on unwashed printed circuit boards during testing.

It is a further object of the present invention to provide a spring contact electrical probe that has a plunger that will continue to operate and reciprocate within the barrel reliably despite prolonged use in hostile and dirty environments.

It is a further object of the present invention to provide a spring contact electrical probe that is not prone to drawing corrosive substances into the barrel as the plunger reciprocates.

These and other objects of the present invention are achieved by providing a spring contact twister probe comprising a barrel having a spring seating end and an open end and at least two crimps between the spring seating end and the open end of the barrel, a compression spring seated within the barrel against the spring seating end of the barrel, and a plunger seated within the barrel and retained therein by the crimp. The plunger includes a shaft having at least two helical crests along a portion of the plunger whereby the crests are engaged by the crimps to cause the plunger to rotate about its longitudinal axis when the plunger reciprocates within the barrel. A portion of the plunger extends beyond the open end of the barrel at all times. The twister section of the plunger remains wholly within the barrel throughout the entire length of the plunger's stroke. The compression spring urges the plunger outwardly of the barrel into engagement with the circuit board to be tested.

The crimps further comprises four V-shaped crimps equally spaced about the circumference of the barrel throughout a single cross section of the barrel. The plunger further includes a probe tip end and a contact stem end. The contact stem end of the plunger has a larger cross section than the cross section of the crimped portion of the barrel, so that the plunger will not become disengaged from the barrel. The compression spring is pressed onto the contact stem of plunger. The plunger further comprises a tail section, a shank section, a twister section or portion between the tail section and the shank section. In the preferred embodiment the plunger is made from a single piece of metal by machining or another process.

The plunger includes a probe tip that is sharpened to a point, such as a chisel point having three sloping faces of equal size and equal angular spacing about the outer perimeter of the probe tip end. In the preferred embodiment, the barrel is cylindrical, the compression spring is cylindrical, and the plunger is substantially cylindrical.

The twister portion of the plunger further comprises a square rod having a longitudinal axis, with the square rod portion being twisted along the longitudinal axis, or a rod having a shape that would be generated by such twisting. More particularly, the square rod is twisted by 90° over a distance of 0.25 inches (0.635 cm), or assumes the shape of such a rod.

Other objects and advantages of this invention will become apparent from the following description taken in connection with the accompanying drawings, wherein is set forth by way of illustration and example, an embodiment of this invention.

DESCRIPTION OF THE PREFERRED EMBODIMENT

As required by the statutes and case law, a detailed embodiment of the present invention is disclosed herein. It is, however, to be understood that the disclosed embodiment is merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Figure 1:
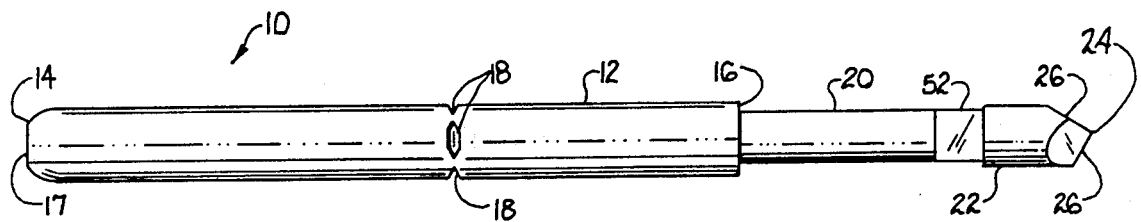
FIG. 1 is a side elevation of the spring contact twister probe according to the present invention.
Figure 2:
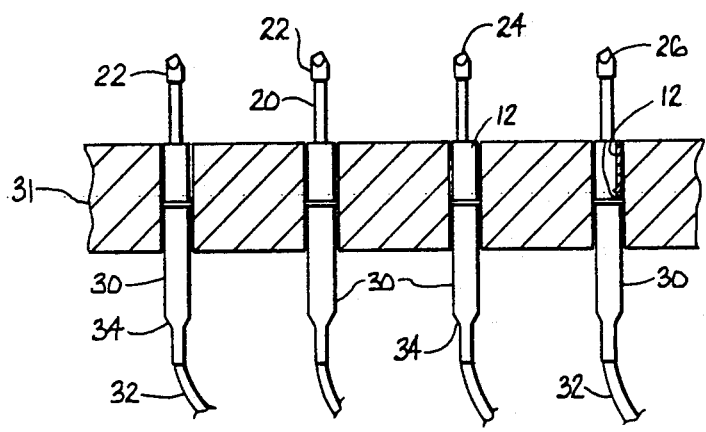
FIG. 2 is a side elevation partially in section of a number of spring contact twister probes seated in receptacles in a matrix board.
Figure 9:
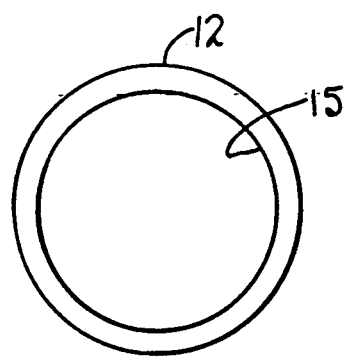
FIG. 9 is an end elevation of an alternative embodiment of the barrel of the spring contact twister probe illustrating the spring seating end of the barrel.

Referring to FIG. 1, there is shown a spring contact twister probe 10 having a barrel 12 with a closed spring seating end 14 and an open end 16. The spring seating end 14 of the barrel 12 may also be open and may include a small inward projecting circumferential flange 15 to retain the compression spring 22, as illustrated in the alternative embodiment in FIG. 9. The flange 15 is flat and extends inward from the circumferential edge of the length of the barrel 12 and perpendicular to the cylindrical surface of the barrel 12. Alternatively, the flange 15 may be recessed into the barrel 15. In the preferred embodiment, however the tip of the rounded spring seating end 14 of the barrel 12 includes a small aperture 17 for alternatively expelling air from the barrel 12 when the plunger 20 is pressed into the barrel 12 and for admitting air into the barrel 12 while the plunge 20 is returning to its fully extended position of repose, which is shown in FIGS. 1 and 2. The fit between the barrel 12 and the plunger 20 is close enough that an air bleed hole of some type is required for proper operation of the probe 10. The barrel 12 may be machined, but preferably is drawn. The barrel 12 further includes four crimps 18, three of which are visible in FIG. 1. The crimps 18 are located in a position intermediate of, that is, between, the spring seating end 14 and the open end 16. All four of the crimps 18 are spaced evenly about the circumference of the barrel along one cross section, that is, the crimps are 90° apart on centers and are all aligned. The spring contact probe 10 further includes a plunger 20 having a probe tip 22 that terminates in a point 24. The point 24 comprises three chiseled faces 26 two of which are visible in FIG. 1. The faces 26 are of the same dimensions and are equally spaced about the circumference of the probe tip 22. Other styles of probe tips are easily designed.

The barrel 12 is cylindrical. The plunger is essentially cylindrical and is preferably made from a single round rod, but comprises a number of different shaped sections, as will be discussed below. The compression spring 28 (FIG. 2) is also substantially cylindrical.

Referring to FIG. 2, there is shown an environmental view of the spring contact twister probes 10 as they are arrayed for use. The spring contact twister probes 10 are seated in suitable receptacles 30 having contact electrical leads 32 exiting from the rear end 34 of the receptacles 30. The leads 32 conduct electrical currents to suitable test apparatus (not shown). The spring contact twister probes 10 are generally disposed in a high density matrix 31 having 20 probes per linear inch or more. In use, the probe tip 20 is brought into engagement with a printed circuit board (not shown) to be tested and the compression spring 28 exerts a continuous outward force on the probe tip 22, urging the probe tip 22 against the circuit board, leading to a good mechanical and electrical connection between the point 24 and the printed circuit board, when the printed circuit board is clean. When, however, the circuit boards are not clean, but retain lacquers and fluxes, it is considerably more difficult to secure a sound mechanical and electrical connection. The spring contact twister probe 10 herein disclosed twists like a drill bit to burrow through the debris to the conducting runners of the circuit board. As illustrated in FIG. 2, the probe tips 22 typically point up, causing any debris loosened by the twisting probe to fall onto the probes and the matrix board. This nearly universal orientation of probes used in testing circuit boards permits them to be contaminated readily, interfering with the mechanical reciprocating operation and electrical conductivity of most probes.

Figure 3:
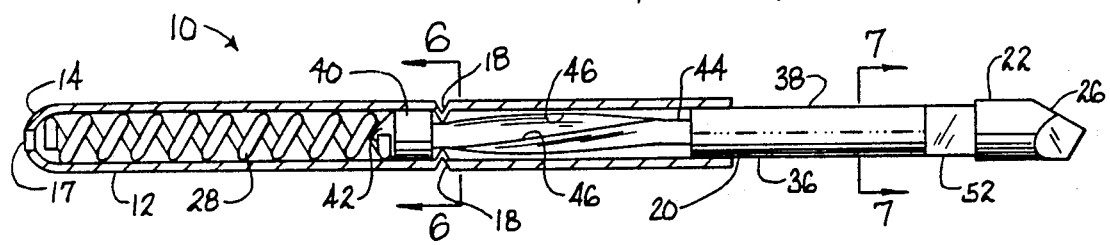
FIG. 3 is an elevation of the spring contact twister probe of FIG. 1 partially in section illustrating the probe in the fully extended position.

Referring now to FIG. 3, the plunger 20 is shown fully extended and clearly includes a probe section 36 that is cylindrical and further comprises the probe tip 22 developed from a cylindrical shape and the shaft or shank 38 which is of smaller diameter than the probe tip 22. Also included is a tail section 40 having a contact stem 42 onto which the compression spring 28 is pressed. Between the tail section 40 and the shaft 38 or probe section 36, lies the twister section 44.

The twister section includes at least two helical crests 46 that are parallel to one another and are opposed to one another. That is, they are 180° apart about the perimeter or circumference of the plunger 20 at all points. In this two crest embodiment, each helical crest is engaged by one crimp 18 with the two crimps 18 being opposite one another, or opposed. This arrangement leads to equal lateral forces being exerted on the plunger 20, primarily perpendicular to the longitudinal axis of the plunger 20, which are translated into rotational forces when the plunger 20 reciprocates within the barrel 12. Any residual lateral forces that are not so translated are cancelled out, thereby reducing or eliminating any tendency of the plunger 20 to wobble as it reciprocates within the barrel 12.

In the preferred embodiment, there are four helical crests 46. The helical crests 46 are preferably formed conceptually by beginning with a square rod having a longitudinal axis along its longitudinal centerline and twisting the rod about the longitudinal axis by 90° over a distance of 0.25 inches (0.635 cm), leading to a twister probe that rotates the probe tip 22 through 90° of rotation about its longitudinal axis during the full length of travel of the plunger 20 relative to the barrel 12. This shape can readily be cut into a round rod by well known machining techniques.

Figure 6:
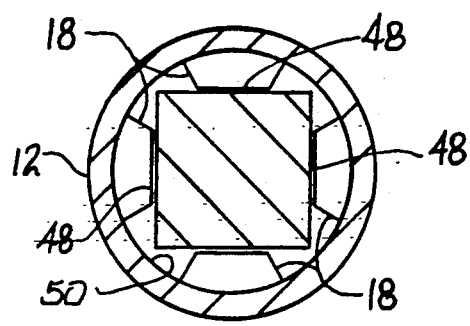
FIG. 6 is a cross sectional view taken along lines 6—6 of FIG. 3.

Referring to FIG. 6, the four crimps 18 form portions of the sides of a square when viewed as a cross section of the barrel 12. The portions of the square sides have substantially the same dimension as the distance from crest-to-crest across any given cross section of the twister section. Thus, the helical crests 46 cannot pass between the flat surfaces or lands 48 formed by the crimps 18. Accordingly, the crests 46 can only pass through the spaces 50 between adjacent crimps 18. One helical crest 46 passes continuously between each of the gaps formed between adjacent crimps 18. For the helical crests 46 to remain in the four gaps or spaces 50, naturally, the plunger 20 must rotate along its longitudinal axis. Thus, some of the longitudinally directed force exerted onto the plunger 20 at the probe tip 22 or the contact stem 42 is translated into rotational force that twists the plunger 22 as it reciprocates in the barrel 12. In other words, longitudinal forces exerted along the axis of the plunger 22 compel rotational movement of the plunger 22 relative to the barrel 12. The barrel 12 is held fast by the receptacle 30 and cannot rotate, so the plunger 22 must rotate along its longitudinal axis, causing the probe tip 22 to burrow through debris to make a good electrical contact. The four equally spaced crimps 18 engaging the four parallel equally spaced helical crests 46 further reduce any tendency to wobble that the plunger 20 may display, providing the structural basis for high pointing accuracy or aim.

Figure 4:
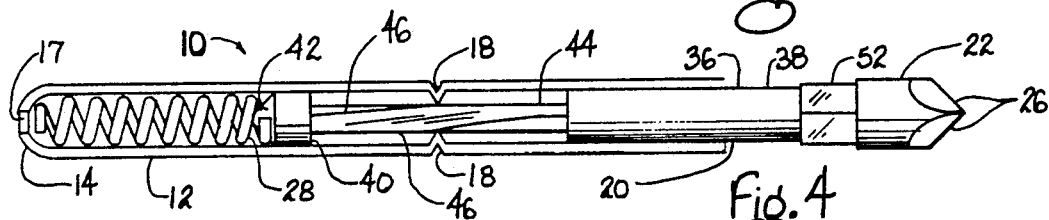
FIG. 4 is an elevation partially in section illustrating the spring contact twister probe with the probe tip in an intermediate position.
Figure 5:
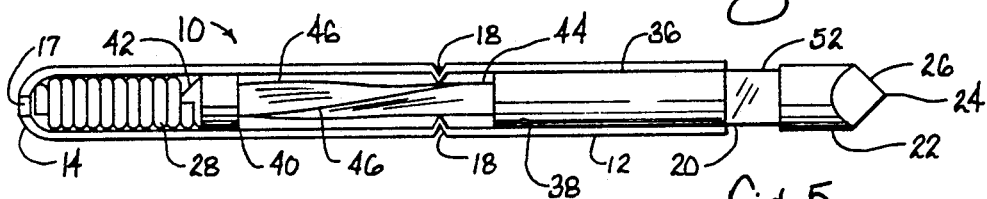
FIG. 5 is an elevation of the probe of FIG. 1 with the probe tip in the fully retracted position.

Referring to FIG. 3, the plunger 20 is shown in a fully extended position. Referring to FIG. 4, the plunger 20 is shown an intermediate position between being fully extended and fully retracted. Referring to FIG. 5, the plunger 20 is shown in the fully retracted position. The plunger 20 is preferably made from a single piece of metal by machining or the like.

Figure 7:
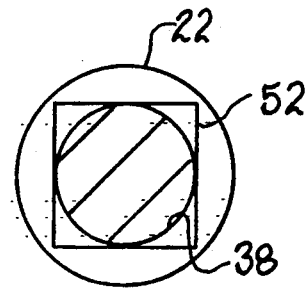
FIG. 7 is a cross sectional view taken along lines 7—7 of FIG. 3.
Figure 8:
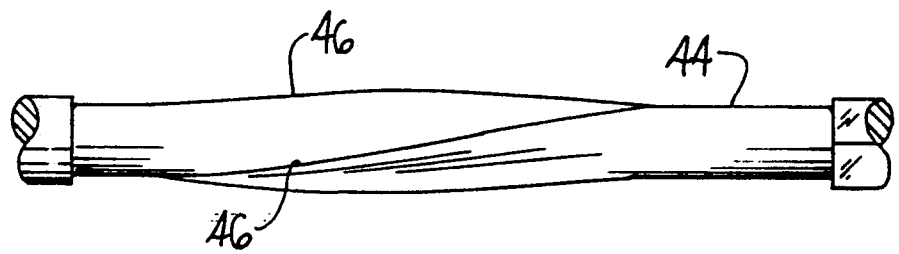
FIG. 8 is a side elevation of the twister portion or section of the plunger.

The design of the spring contact twister probe 10 allows for many different sizes and styles of probe tips 22. The tolerances between the plunger 20 and the open end 16 of the barrel 12 are such that debris cannot readily enter the interior chamber of the barrel 12. The twister section 44 of the plunger 20 is wholly retained inside the barrel 12 at all times, permitting the use of a cylindrical probe section 36 of the plunger 20 to mate with the cylindrical barrel 12, which allows for tighter tolerances and prevents the sharp-edged helical crests 46 from extending beyond the open end 16 of the barrel 12, which would make contamination of the spring contact twister probe 10 easier. All twisting mechanisms are well within the barrel. Further, the crimps 18 are remote from the open end 16 of the barrel 12, further reducing the threat of contamination. In the preferred embodiment illustrated herein, referring to FIG. 7, it is shown that the shaft portion 38 changes from a cylindrical shaft section 38 to square cross section portion 52 prior to assuming a larger cylindrical section comprising the probe tip 22.

The spring contact twister probe 10 fits a standard receptacle and may be used interchangeably in any circuit board tester using industry standard size apertures. The force with which the probe tip 22 contacts the circuit board, as well as the sweep angle, that is, the degree of rotation of the plunger 20 about its longitudinal axis, can be customized to fit an individual circumstances. Different head styles on the probe tip 22 can further increase the ability of the spring contact twister probe 10 to penetrate debris.

It is to be understood that while certain forms of this invention have been illustrated and described, it is not limited thereto, except and in so far as such limitations are included in the following claims.

What is claimed and desired to be secured by Letters patent is as follows:

1. A twisting electrical contact spring probe comprising:
    (a) a substantially cylindrical barrel having a spring seating end and an open end, and four spaced crimps equally spaced about the circumference of said barrel at a location between said spring seating end and said open end said crimps forming portions of the sides of a square when said barrel is viewed in cross section;
    (b) a compression spring seated in said spring seating end of said barrel;
    (c) a probe seated within said barrel and retained within said barrel by said crimps, said plunger further comprising a tail section, a shank section, and a twister section between said tail section and said shank section, and four parallel equal spaced helical crests along said twister section, each said crimp engaging one said helical crest and urging rotation of said plunger as said plunger reciprocates relative to said barrel;
    (d) means for alternatively admitting and expelling air from said cylinder as said plunger reciprocates in said barrel; and
    (e) tip means on said plunger for rotating with said plunger and providing a scraping action.

2. A twisting electrical contact spring probe as claimed in claim 1 wherein said twister section of said plunger further comprises a square rod having a longitudinal axis, said rod having the shape of a square rod that has been twisted relative to said longitudinal axis.

3. A twisting electrical contact spring probe as claimed in claim 2 wherein said twister section appears to have been uniformly twisted 90° over a distance of 0.25 inches relative to said longitudinal axis.

4. A twisting electrical contact spring probe comprising:
    (a) a substantially cylindrical barrel having a spring seating end and an open end and four equally spaced V-shaped crimps about the circumference of said barrel at a location between said spring seating end and said open end;
    (b) a compression spring seated in said spring seating end of said barrel; and
    (c) a plunger seated within said barrel and retained said barrel by said crimps, said plunger further comprising a tail section having a cross section larger than the cross section of said barrel at said crimps, said tail section further comprising a contact stem, said compression spring being pressed onto said contact stem, said tail section being disposed between said spring seating end of said barrel and said crimps, a probe section comprising a probe tip, and a twister section between said tail section and said probe section, said twister section comprising a square rod having the shape of a square rod that has been twisted along its longitudinal axis thereby forming four helical edges along said twister section, each said crimp engaging one said helical crest and urging rotation of said plunger as said plunger reciprocates relative to said barrel, said probe tip rotating with said plunger and for scraping a target surface.

5. A twisting electrical contact spring probe as claimed in claim 4 wherein said plunger is made from a single piece of metal.

6. A twisting electrical contact spring probe as claimed in claim 4 wherein said helical edges mesh with said crimps in said barrel whereby longitudinal movement of said plunger relative to said barrel compels rotational movement of said plunger relative to said barrel.

7. A twisting electrical contact spring probe as claimed in claim 6 wherein said plunger rotates 90° during its full travel in said barrel.

8. A twisting electrical contact spring probe comprising:
   (a) A barrel having a spring seating end and an open end and at least two opposed crimp means between said spring seating end and said open end;
   (b) spring means seated within said barrel;
   (c) a plunger having a shaft reciprocally received within said barrel, said shaft including at least two helical opposed crests along a portion thereof;
   (d) said crimp means extending between said barrel and said shaft, with one said crimp means bearing upon each said helical crest and urging rotation of said plunger as said plunger reciprocates relative to said barrel; and
   (e) tip means on said plunger for rotating with said plunger and providing a scraping action on a target;
   (f) said crimp further comprising four crimps equally spaced about the circumferences of said barrel along a cross section of said barrel to form a crimped portion of said barrel.

9. A twisting electrical contact spring probe as claimed in claim 8 wherein said crimps are V-shaped.

10. A twisting electrical contact spring probe as claimed in claim 8 wherein said twister portion further comprises a square rod having a longitudinal axis, said square rod being twisted along said longitudinal axis forming four symmetrically disposed helical crests that are engaged by said four crimps.

11. A twisting electrical contact spring probe as claimed in claim 10 wherein said square rod is twisted along said longitudinal axis by 90° over a distance of 0.25 inches (0.635 cm).

12. A twisting electrical contact spring probe comprising:
   (a) a barrel having a spring seating end and an open end and at least two substantially opposed crimp means between said spring seating end and said open end;
   (b) spring means seated with said barrel;
   (c) a plunger having a shaft reciprocally received within said barrel, said shaft including a polygonal portion having spaced faces forming helical crests;
   (d) said crimp means respectively having a land tip and extending between said barrel and said shaft with said land tips respectively bearing upon said faces of said shaft polygonal portion, said crimp means holding said shaft therebetween and inducing rotation of said plunger as said plunger reciprocates relative to said barrel; and
   (e) a scraper tip affixed to said plunger for scraping a clean electrical contact area on a target.

* * * * *